United States Patent
Park et al.

(10) Patent No.: US 10,844,198 B2
(45) Date of Patent: Nov. 24, 2020

(54) EPOXY PASTE COMPOSITION INCLUDING A SILVER-COATED COPPER NANOWIRE HAVING CORE-SHELL STRUCTURE, AND CONDUCTIVE FILM INCLUDING SAME

(71) Applicant: BIONEER CORPORATION, Daejeon (KR)

(72) Inventors: Han Oh Park, Daejeon (KR); Jae Ha Kim, Daejeon (KR); Jun Pyo Kim, Daejeon (KR); Jieun Kim, Daejeon (KR)

(73) Assignee: BIONEER CORPORATION, Daejeon (KR)

( * ) Notice: Subject to any disclaimer, the term of this patent is extended or adjusted under 35 U.S.C. 154(b) by 0 days.

(21) Appl. No.: 16/346,740

(22) PCT Filed: Oct. 31, 2017

(86) PCT No.: PCT/KR2017/012115
§ 371 (c)(1),
(2) Date: May 1, 2019

(87) PCT Pub. No.: WO2018/084518
PCT Pub. Date: May 11, 2018

(65) Prior Publication Data
US 2020/0056010 A1    Feb. 20, 2020

(30) Foreign Application Priority Data

Nov. 2, 2016 (KR) ........................ 10-2016-0144890

(51) Int. Cl.

| C09D 5/24 | (2006.01) |
|---|---|
| H01B 1/22 | (2006.01) |
| B32B 5/16 | (2006.01) |
| H01B 1/02 | (2006.01) |
| C08K 9/02 | (2006.01) |
| C08K 3/08 | (2006.01) |
| C09D 163/00 | (2006.01) |
| H05K 9/00 | (2006.01) |

(52) U.S. Cl.
CPC .................. *C08K 9/02* (2013.01); *B32B 5/16* (2013.01); *C08K 3/08* (2013.01); *C09D 5/24* (2013.01); *C09D 163/00* (2013.01); *H01B 1/02* (2013.01); *H01B 1/22* (2013.01); *H05K 9/0083* (2013.01); *C08K 2003/085* (2013.01); *C08K 2003/0806* (2013.01)

(58) Field of Classification Search
CPC .......... C09D 5/24; C09D 163/00; H01B 1/22; H01B 1/02; C08K 2003/085; C08K 2003/0806; B32B 5/16
USPC ................................ 252/514, 500, 510, 511
See application file for complete search history.

(56) References Cited

U.S. PATENT DOCUMENTS

| 2006/0197066 | A1* | 9/2006 | Cheng | ..................... H01L 24/83 252/500 |
|---|---|---|---|---|
| 2010/0140564 | A1* | 6/2010 | Overbreek | ............... H01B 1/22 252/514 |
| 2010/0209690 | A1* | 8/2010 | Sang | ........................ C09D 5/24 428/221 |
| 2011/0291032 | A1* | 12/2011 | Sun | ....................... H01F 1/0063 250/515.1 |
| 2013/0008690 | A1* | 1/2013 | Wiley | .................... H01B 1/026 174/120 C |

FOREIGN PATENT DOCUMENTS

| CN | 103911089 A | 7/2014 | |
|---|---|---|---|
| JP | 2009205899 A | 9/2009 | |
| JP | 2014118589 A | 6/2014 | |
| KR | 1019980042885 A | 8/1998 | |
| KR | 1020090059298 A | 6/2009 | |
| KR | 20150145892 A * | 12/2015 | ............... C09D 5/24 |
| KR | 1020150145892 A | 12/2015 | |
| KR | 1020160099513 A | 8/2016 | |
| WO | 2014021037 A1 | 2/2014 | |
| WO | 2015194850 A1 | 12/2015 | |

OTHER PUBLICATIONS

Luo "Silver-Coated Copper Nanowires with Improved Anti-Oxidation Property as Conductive Fillers in Low-Density Polyethylene." The Canadian Journal of Chem Eng, vol. 91, pp. 630-637, 2013 (Year: 2013).*
ISA Korean Intellectual Property Office, International Search Report Issued in Application No. PCT/KR2017/012115, dated Feb. 5, 2018, WIPO, 4 pages.
Japan Patent Office, Office Action Issued in Application No. 2019-521753, dated Aug. 3, 2020, 11 pages.
European Patent Office, Extended European Search Report Issued in Application No. 17866405.8, dated May 7, 2020, Germany, 8 pages.

* cited by examiner

*Primary Examiner* — Tri V Nguyen
(74) *Attorney, Agent, or Firm* — McCoy Russell LLP

(57) ABSTRACT

The present invention relates to an epoxy paste composition including silver-coated copper nanowires having a core-shell structure, and a conductive film including the same.

10 Claims, 3 Drawing Sheets

EPOXY PASTE COMPOSITION INCLUDING A SILVER-COATED COPPER NANOWIRE HAVING CORE-SHELL STRUCTURE, AND CONDUCTIVE FILM INCLUDING SAME

CROSS-REFERENCE TO RELATED APPLICATIONS

The present application is a U.S. National Phase of International Patent Application Serial No. PCT/KR2017/012115 entitled "EPOXY PASTE COMPOSITION INCLUDING SILVER-COATED COPPER NANOWIRES HAVING CORE-SHELL STRUCTURE, AND CONDUCTIVE FILM INCLUDING SAME," filed on Oct. 31, 2017. International Patent Application Serial No. PCT/KR2017/012115 claims priority to Korean Patent Application No. 10-2016-0144890, filed on Nov. 2, 2016. The entire contents of each of the above-cited applications are hereby incorporated by reference for all purposes.

TECHNICAL FIELD

The present invention relates to an epoxy paste composition using a silver-coated copper nanowire having a core-shell structure, and a conductive film including the same. In detail, the present invention relates to an epoxy paste composition including a silver-coated copper nanowire having a core-shell structure, an epoxy resin, and a curing agent, which is a conductive paste composition having economic efficiency, an excellent electrical characteristic, and a short curing time, and a conductive film formed thereof.

BACKGROUND ART

A silver paste refers to a conductive paste in which a silver power is contained as a filler. Here, the conductive paste refers to a conductive printing ink, a coating material such as paint, and a product line such as an adhesive. DuPont was the first in the world develop these products and had the biggest market share in the world until 20 to 30 years ago. However, since, in 1955, Japanese Research Institute for Electrical Communication began to develop a conductive adhesive and paint and sell the products to chemical companies in Japan, the number of manufacturers has increased. A method in which a conductive paste is applied or printed on a film, a substrate, or a substrate of an electronic component, and dry-cured by heating to form an electrode or electric wiring has been conventionally widely used. However, in accordance with the recent trend toward a high performance of electronic devices, an electrode, a wiring pattern, and the like formed using a conductive paste are demanded to have a lower resistance, and the demand has been strengthened every year.

As an epoxy paste, a 2-component epoxy resin-based conductive paste including an epoxy resin, in which a conductive metal powder is dispersed, and a curing agent has been conventionally widely used. However, since the epoxy resin and the curing agent should be mixed immediately before use of the 2-component epoxy resin-based conductive paste, the 2-component epoxy resin-based conductive paste is difficult to use.

In addition, for exhibiting conductivity required for the conductive paste, a sufficient amount of conductive powder needs to be dispersed in the epoxy resin when preparing. However, the use of a large amount of conductive powder was not preferable due to high cost and weak physical properties such as brittleness. Conventionally, silver nanoparticles or silver flakes having a size of several nanometers to several tens of micrometers have been used as the conductive powder. However, such a material of the silver powder has a low electrical resistance but is expensive. Therefore, development of the material is required to replace silver when preparing a conductive paste.

Accordingly, the present inventors have made efforts to solve the above problems, and as a result, have found that in a case where an epoxy paste composition is prepared using a silver-coated copper nanowire having a core-shell structure as a filler, it is possible to prepare an epoxy paste composition which has an excellent adhesiveness to a substrate, may have a high conductivity even when dried at a low temperature, has a short curing time, and has an excellent economic efficiency and productivity, and completed the present invention.

DISCLOSURE

Technical Problem

In order to solve the above problems, an object of the present invention is to provide an epoxy paste composition including a silver-coated copper having a core-shell structure which has an excellent economic efficiency and conductivity, and a short curing time.

In addition, another object of the present invention is to provide a conductive film having a low specific resistance and a high electromagnetic interference shielding effectiveness produced by applying an epoxy paste composition including a silver-coated copper nanowire having a core-shell structure on a substrate, and then performing a heat treatment.

Technical Solution

As a result of research for achieving the above objects, the present inventors found an epoxy paste composition including a silver-coated copper nanowire having a core-shell structure, an epoxy resin, and a curing agent, and a conductive film formed thereof, which can significantly lower a specific resistance and improve an electromagnetic interference shielding effectiveness, and completed the present invention.

In one general aspect, an epoxy paste composition includes: 55 to 70 wt % of a silver-coated copper nanowire having a core-shell structure; 1 to 35 wt % of an epoxy resin; and 1 to 35 wt % of a curing agent.

An amount of silver is 2 to 60 parts by weight based on 100 parts by weight of a total amount of the silver-coated copper nanowire.

A ratio (f/a) of the largest diameter (f) of a cross section of the silver-coated copper nanowire perpendicular to a length direction to a length (a) of the silver-coated copper nanowire may be 0.0001 to 0.06.

The curing agent may be any one or two or more selected from the group consisting of an acid anhydride-based curing agent, a phenol-based curing agent, an imidazole-based curing agent, and an amino-based curing agent.

The epoxy resin may be any one or two or more selected from the group consisting of a bisphenol A type epoxy resin, a bisphenol F type epoxy resin, a bisphenol S type epoxy resin, a phenol novolac type epoxy resin, a cresol novolac type epoxy resin, an alkylphenol novolac type epoxy resin, a biphenyl type epoxy resin, a naphthalene type epoxy resin, a dicyclopentadiene type epoxy resin, triglycidyl isocyanate, an urethane-modified epoxy resin, and a non-aromatic epoxy resin.

The epoxy paste composition may further include a diluent, and the diluent may be any one or two or more selected from the group consisting of acetone, methyl ethyl ketone, methyl alcohol, ethyl alcohol, isopropyl alcohol, butyl alcohol, ethylene glycol, polyethylene glycol, tetrahydrofuran, dimethylformamide, dimethylacetamide, N-methyl-2-pyrrolidone, hexane, cyclohexanone, toluene, chloroform, dichlorobenzene, dimethylbenzene, trimethylbenzene, pyridine, methylnaphthalene, nitromethane, acrylonitrile, octadecylamine, aniline, dimethyl sulfoxide, diethylene glycol ethyl ether, and terpineol.

In another general aspect, a conductive film may be produced by applying the epoxy paste composition on a substrate and performing a heat treatment.

The heat treatment may be performed at 100 to 200° C. for 20 to 60 minutes.

A specific resistance of the conductive film may be $1.0 \times 10^{-5}$ to $6.0 \times 10^{-6}$ $\Omega \cdot m$, and an electromagnetic interference shielding effectiveness of the conductive film at 1500 MHz may be 20 to 70 dB.

Advantageous Effects

The epoxy paste composition according to the present invention includes a silver-coated copper nanowire, such that the epoxy paste composition has oxidation stability and thermal stability. Therefore, the epoxy paste composition has a binding force with the epoxy resin and a high dispersibility. Accordingly, the epoxy paste composition has an excellent electrical conductivity and a short curing time due to a low sheet resistance and specific resistance, which may realize an excellent conductivity and electromagnetic interference shielding property. In addition, with the advantages described above, the epoxy paste composition may be widely used in various fields such as an electromagnetic interference shielding and an absorbing product, an electrode, an electronic circuit, an antenna, and the like.

BEST MODE

Figure 1:
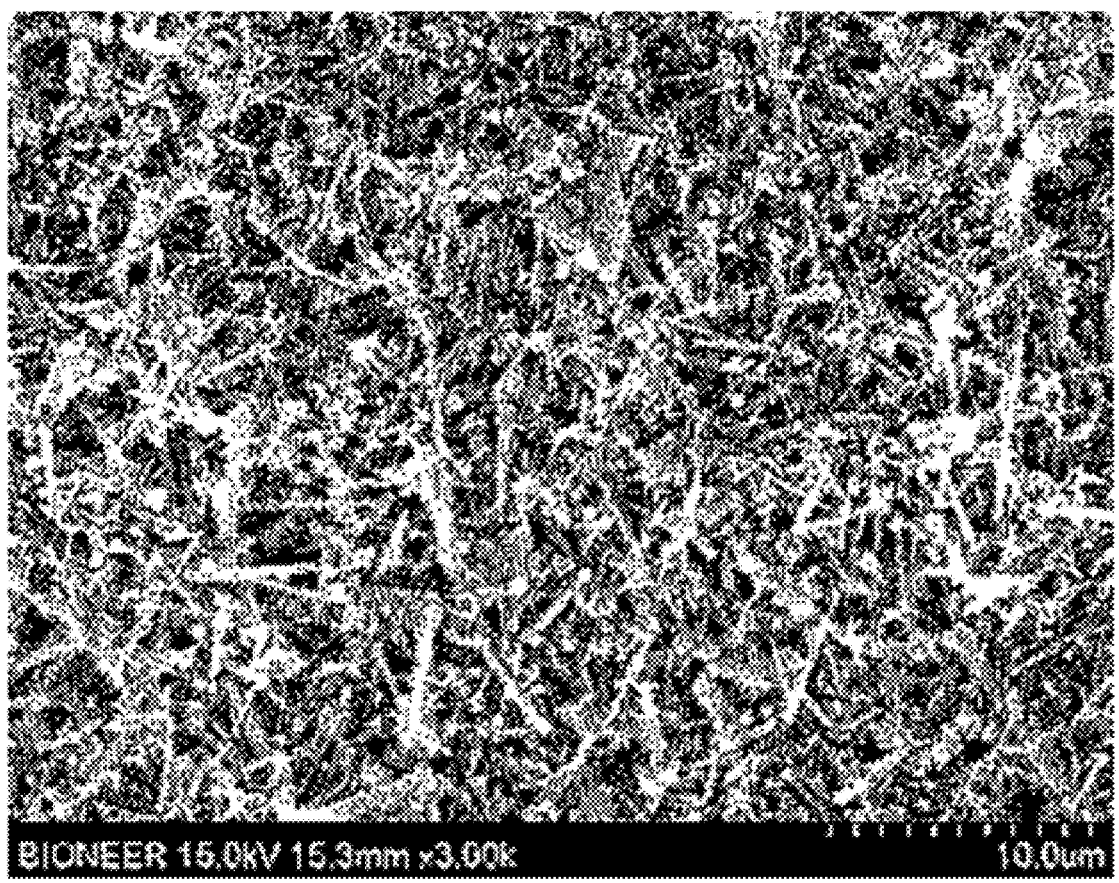
FIG. 1 is a photograph obtained by observing a substrate coated with an epoxy paste composition including a silver-coated copper nanowire according to an example of the present invention with a scanning electron microscope (SEM).
Figure 2:
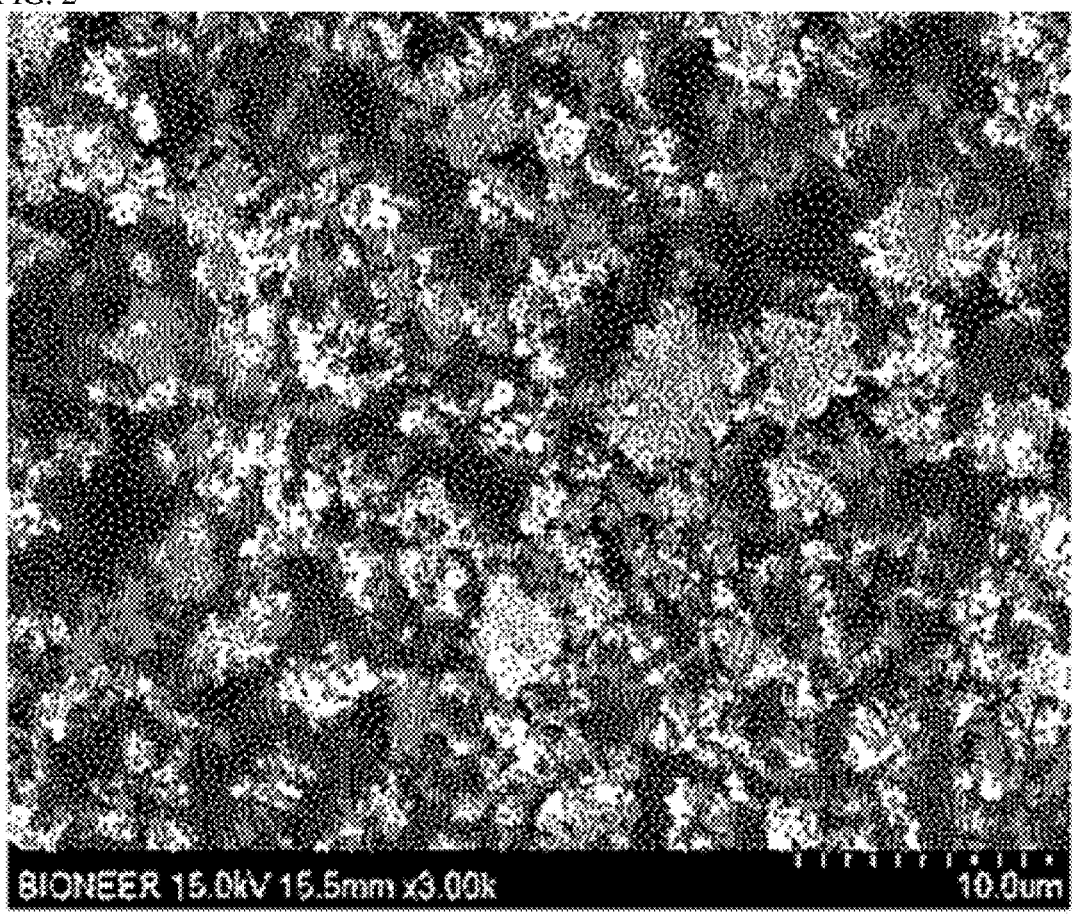
FIG. 2 is a photograph obtained by observing a substrate coated with an epoxy paste composition including silver flakes according to a comparative example of the present invention with a scanning electron microscope (SEM).

Hereinafter, an epoxy paste composition including a silver-coated copper nanowire having a core-shell structure according to an embodiment of the present invention, and a conductive film including the same will be described in more detail. However, the following embodiments are only a reference example for describing the present invention in detail, and the present invention is not limited thereto and may be implemented in various forms.

In addition, unless otherwise defined, all terms of technical and scientific terms used herein have the same meaning as commonly understood by one of those skilled in the art to which the present invention pertains. The terms used herein are only for effectively describing a certain embodiment rather than limiting the present invention.

The term "nanowire" in the present specification refers to a filler in which a silver-coated copper nanowire used as a conductive filler has a diameter measured in nanometers and a long shape similar to a wire.

The term "silver-coated copper nanowire" in the present specification refers to a nanowire having a core-shell structure including a core formed of a copper nanowire and a shell formed of silver.

The present invention in order to achieve the above object relates to an epoxy paste composition including a silver-coated copper nanowire having a core-shell structure, and a conductive film including the same.

The present invention will be described in detail.

The epoxy paste composition in the present invention may include 55 to 70 wt % of a silver-coated copper nanowire having a core-shell structure, 1 to 35 wt % of an epoxy resin, and 1 to 35 wt % of a curing agent. The epoxy paste composition in the present invention may preferably include 60 to 70 wt % of a silver-coated copper nanowire having a core-shell structure, 10 to 35 wt % of an epoxy resin, and 10 to 35 wt % of a curing agent.

Since the epoxy paste composition described above includes the silver-coated copper nanowire, the epoxy resin, and the curing agent, although the exact reason is not known, surprisingly, the epoxy paste composition in the present invention has an excellent oxidation stability and thermal stability, such that a binding force with the epoxy resin and a high dispersibility may be improved. Accordingly, the epoxy paste composition has a high electrical conductivity due to the significantly lowered specific resistance and the sheet resistance, and conductivity is significantly improved when the substrate is applied, such that the conductive film may have an excellent conductivity and electromagnetic interference shielding property.

When a content of the silver-coated copper nanowire included in the epoxy paste composition is in the range of 55 to 70 wt %, and preferably 60 to 70 wt % based on a total content of the epoxy paste composition, the epoxy paste composition may have a high conductivity when being coated on the substrate, and a non-uniform dispersion of the silver-coated copper nanowire due to a high viscosity of the composition may be prevented, which is preferable.

The nanowire having a core-shell structure according to the present invention is a silver-coated copper nanowire having a core-shell structure including a core formed of a copper nanowire and a shell formed of silver, and has an excellent oxidation stability and thermal stability in comparison to a conventional copper nanowire, for example, a copper nanowire not coated with silver, a spherical particle, a flake shape, or the like.

In addition, the nanowire having a core-shell structure has a good dispersibility due to the shape thereof in comparison to a metal nanoparticle. Since the shape of the nanowire is different from that of the particle or the flakes, a sheet resistance of a conductive film may be significantly lowered. Further, a production cost may be reduced by using a silver-coated copper nanowire in comparison to using a silver nanowire.

According to an aspect of the present invention, an amount of silver may be 2 to 60 parts by weight based on 100 parts by weight of a total amount of the silver-coated copper nanowire. When silver is coated in the content described above, the copper nanowire may be uniformly coated with the silver, has an excellent oxidation stability and thermal stability, and may prevent generation of a separate silver particle generated by including excess silver, which is preferable.

According to an aspect of the present invention, a ratio (f/a) of the largest diameter (f) of a cross section of the silver-coated copper nanowire perpendicular to a length direction on to a length (a) of the silver-coated copper nanowire may be 0.0001 to 0.06, but is not limited thereto.

When the ratio (f/a) is within the range described above, a high conductivity of the epoxy paste composition may be realized even at a low density of the nanowire, and a sheet resistance and specific resistance may be lowered after curing, which is preferable.

In detail, a length of the silver-coated copper nanowire may be 5 to 10 μm and a diameter of the silver-coated copper nanowire may be 200 to 300 nm, but is not limited thereto.

When the silver-coated copper nanowire has the diameter of the range described above, a high ratio (f/a) is secured, such that a conductive film having a high conductivity and a low sheet resistance may be implemented. Further, an electron movement path having a large area relative to a surface area of the silver-coated copper nanowires is secured, such that electrical characteristics may be improved and the silver-coated copper nanowire has flexibility, which is preferable.

When the silver-coated copper nanowire has the length of the range described above, a high ratio (f/a) is secured, such that a conductive film having a high conductivity and a low sheet resistance may be implemented. Further, a connection length at which the silver-coated copper nanowires are in contact with each other is secured, such that electrical characteristics may be improved and physical breakage of the silver-coated copper nanowire may be prevented when coating the substrate, which is preferable.

In a case where the epoxy paste composition includes 1 to 35 wt % of an epoxy resin, and preferably 10 to 30 wt % of an epoxy resin based on the total content of the epoxy paste composition, the epoxy paste composition according to the present invention may be prevented from being peeled off from the substrate due to a high adhesion to a substrate when being coated on the substrate and may prevent deterioration in conductivity due to an excess epoxy resin without loss of inherent physical properties of the epoxy resin, which is preferable.

According to an aspect of the present invention, the epoxy resin may be any one or two or more epoxy resins selected from the group consisting of a bisphenol A type epoxy resin, a bisphenol F type epoxy resin, a bisphenol S type epoxy resin, a phenol novolac type epoxy resin, a cresol novolac type epoxy resin, an alkylphenol novolac type epoxy resin, a biphenyl type epoxy resin, a naphthalene type epoxy resin, a dicyclopentadiene type epoxy resin, triglycidyl isocyanate, an urethane-modified epoxy resin, and an epoxy resin, but is not limited thereto.

In addition, in a case where the epoxy paste composition includes 1 to 35 wt % of a curing agent, and preferably 10 to 30 wt % of a curing agent based on the total content of the epoxy paste composition, the epoxy paste composition according to the present invention may have a short curing time and does not require a high curing temperature, which is preferable. Further, since curing caused by a small impact or stimulation does not occur, it is easy to store the epoxy paste composition, which is preferable.

According to an aspect of the present invention, the curing agent may be any one or two or more selected from the group consisting of an acid anhydride-based curing agent, a phenol-based curing agent, an imidazole-based curing agent, and an amino-based curing agent, but is not limited thereto.

In a specific example of the curing agent, as the acid anhydride-based curing agent, any one or two or more selected from the group consisting of phthalic anhydride, maleic anhydride, trimellitic anhydride, pyromellitic anhydride, hexahydrophthalic anhydride, tetrahydrophthalic anhydride, methyl nadic anhydride, nadic anhydride, glutaric anhydride, methylhexahydrophthalic anhydride, methyltetrahydrophthalic anhydride, and the like may be used.

As the phenol-based curing agent, any one or two or more selected from the group consisting of phenol resins such as a formaldehyde condensed resol type phenol resin, a non-formaldehyde condensed phenol resin, a novolac-type phenol resin, a novolac-type phenol formaldehyde resin, and a polyhydroxystyrene resin; resol type phenol resins such as an aniline-modified resol resin and a melamine-modified resol resin; novolac-type phenol resins such as a phenol novolac resin, a cresol novolac resin, a tert-butylphenol novolac resin, a nonylphenol novolac resin, and a naphthol novolac resin; special phenol resins such as a dicyclopentadiene-modified phenol resin, a terpene-modified phenol resin, a triphenolmethane-type resin, and a phenol aralkyl resin and a naphthol aralkyl resin having a phenylene skeleton or a diphenylene skeleton; polyhydroxystyrene resins such as a poly(p-hydroxystyrene) resin; and the like may be used.

The amino-based curing agent may be any one or two or more selected from the group consisting of dimethyl dicykan (DMDC), dicyandiamide (DICY), isophorone diamine (IPDA), diethylenetriamine (DETA), triethylenetetramine (TETA), bis(p-aminocyclohexyl) methane (PACM), methylenedianiline (for example, 4,4'-methylenedianiline), polyetheramine, for example, polyetheramine D230, diaminodiphenylmethane (DDM), diaminodiphenylsulfone (DDS), 2,4-toluenediamine, 2,6-toluenediamine, 2,4-diamino-1-methylcyclohexane, 2,6-diamino-1-methylcyclohexane, 2,4-diamino-3,5-diethyltoluene, 2,6-diamino-3,5-diethyltoluene, 1,2-diaminobenzene, 1,3-diaminobenzene, 1,4-diaminobenzene, diamino diphenyl oxide, 3,3',5,5'-tetramethyl-4,4'-diaminobiphenyl, 3,3'-dimethyl-4,4'-diaminodiphenyl, and the like. As the amino-based curing agent, any one or two or more selected from the group consisting of dimethyl dicykan (DMDC), dicyandiamide (DICY), isophorone diamine (IPDA), and methylenedianiline may be used.

According to an aspect of the present invention, the epoxy paste composition may further include a diluent. A content of the diluent may be adjusted depending on a viscosity of the epoxy paste, and a content of diluent may be preferably 15 to 30 parts by weight with respect to total 100 parts by weight of the epoxy paste composition, but is not limited thereto. In a case where the content of the diluent is in the range described above, since the epoxy paste composition has a viscosity which can be uniformly applied when coating is performed, the silver-coated copper nanowire may be uniformly dispersed, such that the conductive film has a high electrical conductivity and an improved electromagnetic interference shielding property, which is preferable. The diluent may be any one or two or more selected from the group consisting of acetone, methyl ethyl ketone, methyl alcohol, ethyl alcohol, isopropyl alcohol, butyl alcohol, ethylene glycol, polyethylene glycol, tetrahydrofuran, dimethylformamide, dimethylacetamide, N-methyl-2-pyrrolidone, hexane, cyclohexanone, toluene, chloroform, dichlorobenzene, dimethylbenzene, trimethylbenzene, pyridine, methylnaphthalene, nitromethane, acrylonitrile, octadecylamine, butyl carbitol acetate, aniline, dimethyl sulfoxide, diethylene glycol ethyl ether, and terpineol.

The epoxy paste composition in the present invention may be uniformly applied when applied on a substrate, such as coating, casting, and the like, and may be prepared to have a viscosity of 300,000 to 400,000 cps measured at 25° C. so as to improve processability.

The conductive film in the present invention may be a conductive film in which a substrate is applied with the epoxy paste composition and subjected to a heat treatment.

Specifically, the substrate is applied with the epoxy paste composition including 55 to 70 wt % of a silver-coated copper nanowire having a core-shell structure, 1 to 35 wt % of an epoxy resin, and 1 to 35 wt % of a curing agent and may be subjected to a heat treatment. Preferably, the substrate is applied with the epoxy paste composition including 60 to 70 wt % of a silver-coated copper nanowire having a core-shell structure, 10 to 30 wt % of an epoxy resin, and 10 to 30 wt % of a curing agent and may be subjected to the heat treatment.

The substrate may be a substrate formed of an organic or inorganic material, and specifically, may be a plastic substrate, a glass substrate, or a quartz substrate. Examples of materials constituting the substrate may be selected from a methacrylic resin, aromatic polyester, modified polyphenylene oxide (MPPO), cellulose ester, cellulose acetate, quartz, a styrene-butadiene copolymer, silicon wafer, acrylonitrile butadiene styrenecopolymer (ABS resin), an epoxy resin, an olefin maleimide copolymer, fused silica, glass, regenerated cellulose, triacetyl cellulose, a phenol resin, polydimethyl cyclohexene terephthalate, polydimethylsiloxane (PDMS), polymethylmethacrylate, polymethylacrylate, polybutadiene, polybutylene terephthalate, polyvinylidene fluoride, polyvinyl acetate, polysulfonate, polysulfone, polystyrene (PS), polysilazane, polysilane, polysiloxane, polyaramid, polyarylate, polyamide, polyamide-imide, polyacrylate, polyacrylonitrile (PAN), polyester, polyethersulfone (PES), polyether nitrile, polyether sulfone, polyether imide, polyether ketone, polyethylenenaphthalte (PEN), polyethylene sulfone, polyethylene (PE), polyethylene terephtalate (PET), polyethylmetacrylate, polyethylacrylate, polyepoxide, polyvinyl chloride, polyoxyethylene, polyolefin, polyurethane, a polyimide resin, polycarbosilane, polycarbonate, polyphenylene sulfide, polyphenylene ether, polypropylene (PP), an AS resin, GaAs, MaO, silica, polycarbon, and the like, but are not limited thereto.

The substrate according to an aspect may be selectively subjected to an additional surface treatment by using at least one method of a Piranha solution treatment method, an acid treatment method, a base treatment method, an atmospheric plasma treatment method, an ozone treatment method, an ultraviolet (UV) treatment method, a self assembled monolayer (SAM) treatment method, and a polymer or monomolecular coating method.

The heat treatment in the present invention may be performed at 100 to 200° C. for 10 to 60 minutes. A curing reaction of the epoxy paste composition occurs during the heat treatment process. At this time, the curing reaction may include a semi-curing reaction of a reaction material. As described above, in the case where the semi-curing reaction proceeds when the heat treatment is performed, an additional curing reaction further proceeds as a process subsequent to a pressurizing process such as laminating and hot pressing, such that a complete cured reaction product may be obtained.

The heat treatment is preferably performed at 100 to 200° C., more preferably 120 to 200° C., still more preferably 150 to 200° C. for physical properties of the film.

In addition, the epoxy paste composition in the present invention may be heat-treated preferably within 10 to 60 minutes, more preferably 10 to 40 minutes, and still more preferably 10 to 30 minutes. Even though the epoxy paste composition is cured in a short time, a low specific resistance and sheet resistance are constant without increasing; therefore, the epoxy paste composition may have an excellent economic efficiency and productivity.

The epoxy paste composition in the present invention may be coated to the substrate through an application method selected from a spray coating method, a gravure coating method, a microgravure coating method, a bar-coating method, a knife coating method, a reverse roll coating method, a roll coating method, a calender coating method, a curtain coating method, an extrusion coating method, a cast coating method, a dip coating method, an air-knife coating method, a foam coating method, a slit coating method, and the like, but is not limited thereto.

According to an aspect of the present invention, in order for improvements in electromagnetic interference shielding ability, bending property, an adhesive force, and interlayer adhesion and uniform application to the substrate, the epoxy paste composition may be applied on the substrate at a thickness of 50 to 200 μm, and preferably 50 to 150 μm.

According to an aspect of the present invention, in order for improvements in electromagnetic interference shielding ability, bending property, an adhesive force, and interlayer adhesion of the conductive film, the thickness of the conductive film may be 1 to 100 μm, and preferably 25 to 80 μm.

When the conductive film produced using the epoxy paste composition in the present invention has a thickness of 1 to 100 μm, a specific resistance of the conductive film may be $1.0 \times 10^{-5}$ to $6.0 \times 10^{-6}$ Ω·m, and an electromagnetic interference shielding effectiveness of the conductive film at 1500 MHz may be 20 to 70 dB. Preferably, in order to have an excellent electrical conductivity and electromagnetic interference shielding ability in the conductive film, when the conductive film produced using the epoxy paste composition in the present invention has a thickness of 25 to 80 μm, a specific resistance of the conductive film may be $1.0 \times 10^{-6}$ to $6.0 \times 10^{-6}$ Ω·m, and an electromagnetic interference shielding effectiveness of the conductive film at 1500 MHz may be 50 to 70 dB.

In the epoxy paste composition including the silver-coated copper nanowire having a core-shell structure according to the present invention having the configuration described above, the silver-coated copper nanowire having a core-shell structure has an excellent binding force with the epoxy resin and dispersibility, although the exact reason is not known, surprisingly, the conductive film has a high electrical conductivity due to the significantly lowered specific resistance and the sheet resistance, and conductivity is significantly improved when the substrate is applied, such that the conductive film may have an excellent conductivity and electromagnetic interference shielding property.

Hereinafter, an epoxy paste composition including a silver-coated copper nanowire having a core-shell structure according to examples of the present invention, and the epoxy paste composition including the same will be described in more detail. However, the following examples and comparative examples are only one reference example for describing the present invention in detail, the present invention is not limited thereto, and may be implemented in various forms.

Unless otherwise defined, all terms of technical and scientific terms used herein have the same meaning as commonly understood by one of those skilled in the art to which the present invention belongs. The terms used herein are only for effectively describing a certain example rather than limiting the present invention.

Further, unless otherwise stated in the specification, the unit of added materials may be wt %.

[Physical Property Measurement Method]

1) Form and structure measurement: A coating form of an epoxy paste composition using a silver-coated copper nanowire having a core-shell structure was measured with a scanning electron microscope (SEM) (FEI, SIRION).

2) Sheet resistance: In order to compare electrical conductivities, a sheet resistance of the conductive film produced by the following examples was measured with a four-point probe sheet resistance meter (Loresta-GP, MCP-T610, MITSUBISHI CHEMICAL ANALYTECH). When measuring the sheet resistance of the conductive film with the four-point probe sheet resistance meter, the measurement was performed by dividing the film into four parts, and then an average value was obtained. A specific resistance was calculated by applying a film thickness to the measured sheet resistance value.

3) Paste coating: A polyimide film was coated with the prepared epoxy paste composition using a bar coater (ER-ICHSEN, Model-510).

4) Film thickness measurement: The film thickness was measured with a thickness gauge (ERICHSEN, Foil Thickness Gauge Model 497).

5) electromagnetic interference shielding effectiveness measurement: In order to measure an electromagnetic interference shielding effectiveness of the conductive film, the electromagnetic interference shielding effectiveness was measured using a network analyzer (Protek, A333).

Example 1

8 g of a silver-coated copper nanowire having a core-shell structure (BIONEER CORPORATION), 2 g of an epoxy resin (SE-55F, SHIN-A T&C), 3 g of a curing agent (XHT-1004, SHIN-A T&C), 2.5 g of terpineol ($\alpha$-terpineol, SAMCHUN CHEMICALS), and 0.5 g of butyl carbitol acetate (SAMCHUN CHEMICALS) were put into a 100 ml Erlenmeyer flask and stirred with a revolution-rotation mixer (ARE-310, THINKY) at 2000 rpm for 30 minutes. Then, an epoxy paste composition was prepared by performing dispersion treatments five times using a 3-rollmill (EXAKT 50).

In order to perform a conductive test for the epoxy paste composition prepared in Example 1, 10 ml of the epoxy paste composition was applied on a polyimide film of 100 mm×100 mm, and then coating was performed using a bar coater capable of coating a film at a wet thickness of 100 μm. The produced conductive film was heated in a dry oven at a temperature rising rate of 2° C./min up to 150° C., and then, in order to examine a dry condition, the conductive films were prepared by being subjected to a heat treatment at 150° C. for 15 minutes, 30 minutes, and 60 minutes. At this time, the final thickness of the dried epoxy paste composition was 20 μm.

When the entire epoxy paste composition was prepared as in the condition of Example 1, as shown in Table 1, the specific resistance of $4.6\times10^{-6}$ Ω·m was constantly measured even when the curing time was increased from 15 minutes to 60 minutes. Therefore, it was confirmed that curing may be performed in a short time under the optimal condition of a temperature of 150° C. and a curing time of 15 minutes, such that economic efficiency and productivity may be improved.

Example 2

Example 2 was performed in the same manner as in Example 1, except that 11 g of a silver-coated copper nanowire was used.

It was confirmed that, $4.9\times10^{-6}$ Ω·m of a specific resistance of an epoxy paste composition prepared in Example 2 was measured without change over a heat treatment time as shown in Table 1.

Example 3

Example 3 was performed in the same manner as in Example 1, except that 1.5 g of a curing agent was used.

It was confirmed that, in an epoxy paste composition prepared in Example 3, a specific resistance of a conductive film was changed depending on the curing condition when the epoxy paste composition is used in production of the conductive film. In the case where the heat treatment was performed at 150° C. for 15 minutes, the specific resistance of the conductive film was $1.2\times10^{-5}$ Ω·m, in the case where the heat treatment was performed at 150° C. for 30 minutes, the specific resistance of the conductive film was lowered to $9.9\times10^{-6}$ Ω·m, and in the case where the heat treatment was performed at 150° C. for 60 minutes, the specific resistance of the conductive film was further lowered slightly to $9.0\times10^{-6}$ Ω·m. Accordingly, it was confirmed that the curing time is required to be increased as the content of the curing agent is decreased.

Example 4

Example 4 was performed in the same manner as in Example 1, except that 3.5 g of a curing agent was used.

It was confirmed that in an epoxy paste composition prepared in Example 4, a specific resistance of a conductive film was almost not changed even though the curing time was increased when the epoxy paste composition is used in production of the conductive film. It can be confirmed that the epoxy paste composition was cured within less than 15 minutes due to an increase in the content of the curing agent in the preparation of the epoxy paste composition. In addition, it was confirmed that physical properties of the epoxy paste composition in the present invention does not deteriorate even when the heat treatment is performed additionally time after curing.

Comparative Example 1

Comparative Example 1 was performed in the same manner as in Example 1, except that silver flakes were used instead of the silver-coated copper nanowire.

The specific resistance in Example 1 was $4.6\times10^{-6}$ Ω·m, whereas the specific resistance in Comparative Example 1 was $2.4\times10^{-4}$ Ω·m when the epoxy paste composition was prepared using silver flakes. It was confirmed that the specific resistance in Comparative Example 1 was increased two orders of magnitude as compared with Example 1. It was confirmed that a further low specific resistance may be obtained when the conductive film was produced using the epoxy paste composition including the silver-coated copper nanowire. According to these results, it was confirmed that the epoxy paste composition prepared using the silver-coated copper nanowire has a more excellent economic efficiency and physical properties than those of the epoxy paste composition prepared using silver flakes.

Comparative Example 2

Comparative Example 2 was performed in the same manner as in Example 1, except that a silver nanoparticle was used instead of the silver-coated copper nanowire.

The specific resistance in Example 1 was $4.6 \times 10^{-6}$ Ω·m, whereas the specific resistance in Comparative Example 2 was $4.2 \times 10^{-4}$ Ω·m when the epoxy paste composition was prepared using silver nanoparticles, it was confirmed that the specific resistance in Comparative Example 2 was increased two orders of magnitude as compared with Example 1. It was confirmed that a further low specific resistance may be obtained when the conductive film was produced using the epoxy paste composition including the silver-coated copper nanowire. According to these results, it was confirmed that the epoxy paste composition prepared using the silver-coated copper nanowire has a more excellent economic efficiency and physical properties than those of the epoxy paste composition prepared using silver nanoparticles.

Comparative Example 3

Comparative Example 3 was performed in the same manner as in Example 1, except that a copper nanowire was used instead of the silver-coated copper nanowire.

The specific resistance in Example 1 was $4.6 \times 10^{-6}$ Ω·m, whereas the specific resistance in Comparative Example 3 was $6.7 \times 10^{-2}$ Ω·m when the epoxy paste composition was prepared using a copper nanowire, it was confirmed that the specific resistance in Comparative Example 3 was increased by four orders of magnitude as compared with Example 1. It was confirmed that a sheet resistance and specific resistance of the conductive film was sharply increased due to oxidation of the copper nanowire by the heat treatment when the epoxy paste composition was produced using the copper nanowire. According to these results, it was confirmed that, in a case where the conductive film was produced using the epoxy paste composition including a silver-coated copper nanowire, a further low specific resistance of the conductive film may be obtained in comparison to using of the copper nanowire.

Comparative Example 4

Comparative Example 4 was performed in the same manner as in Example 1, except that 5.5 g of a silver-coated copper nanowire was used.

It was confirmed that, in an epoxy paste composition prepared in Comparative Example 4, since a content of the silver-coated copper nanowire was low, an area of an electron movement path was decreased, such that a specific resistance was increased.

Comparative Example 5

Comparative Example 5 was performed in the same manner as in Example 1, except that 15 g of a silver-coated copper nanowire was used.

Since viscosity of an epoxy paste composition prepared in Comparative Example 5 was too high, components of the composition were not uniformly dispersed and the composition was not coated in a film shape, therefore a specific resistance value was not measured.

Comparative Example 6

Comparative Example 6 was performed in the same manner as in Example 1, except that 0.1 g of an epoxy resin was used.

In an epoxy paste composition prepared in Comparative Example 5, the film was peeled off due to deterioration in adhesiveness between components of the composition. Therefore a specific resistance value was not measured.

Comparative Example 7

Comparative Example 7 was performed in the same manner as in Example 1, except that 5 g of an epoxy resin was used.

It was confirmed that when a conductive film was produced using an epoxy paste composition prepared in Comparative Example 7 and a specific resistance was measured, the specific resistance was sharply increased due to decrease in contact between silver-coated copper nanowires by an increase of a content of the epoxy resin.

TABLE 1

| | Dry condition | | |
|---|---|---|---|
| | 150° C., 15 min | 150° C., 30 min | 150° C., 60 min |
| Example 1 (Ω · m) | $4.4 \times 10^{-6}$ | $4.6 \times 10^{-6}$ | $4.6 \times 10^{-6}$ |
| Example 2 (Ω · m) | $4.9 \times 10^{-6}$ | $4.9 \times 10^{-6}$ | $4.9 \times 10^{-6}$ |
| Example 3 (Ω · m) | $1.2 \times 10^{-5}$ | $9.9 \times 10^{-6}$ | $9.0 \times 10^{-6}$ |
| Example 4 (Ω · m) | $6.6 \times 10^{-6}$ | $6.4 \times 10^{-6}$ | $6.4 \times 10^{-6}$ |
| Comparative Example 1 (Ω · m) | $2.4 \times 10^{-4}$ | $2.4 \times 10^{-4}$ | $2.4 \times 10^{-4}$ |
| Comparative Example 2 (Ω · m) | $4.3 \times 10^{-4}$ | $4.2 \times 10^{-4}$ | $4.2 \times 10^{-4}$ |
| Comparative Example 3 (Ω · m) | $6.1 \times 10^{-2}$ | $6.7 \times 10^{-2}$ | $6.7 \times 10^{-2}$ |
| Comparative Example 4 (Ω · m) | $3.9 \times 10^{-4}$ | $3.9 \times 10^{-4}$ | $3.8 \times 10^{-4}$ |
| Comparative Example 5 (Ω · m) | Non-measurable | Non-measurable | Non-measurable |
| Comparative Example 6 (Ω · m) | Non-measurable | Non-measurable | Non-measurable |
| Comparative Example 7 (Ω · m) | $1.0 \times 10^{-3}$ | $1.1 \times 10^{-3}$ | $1.1 \times 10^{-3}$ |

Experimental Example 1

Electromagnetic Interference Shielding Test Depending on Thickness

As the conductive films of Example 1, coated films having wet thicknesses of 100 μm and 200 μm were produced with a bar coater in order to confirm electromagnetic interference shielding ability depending on a thickness of the conductive film.

Figure 3:
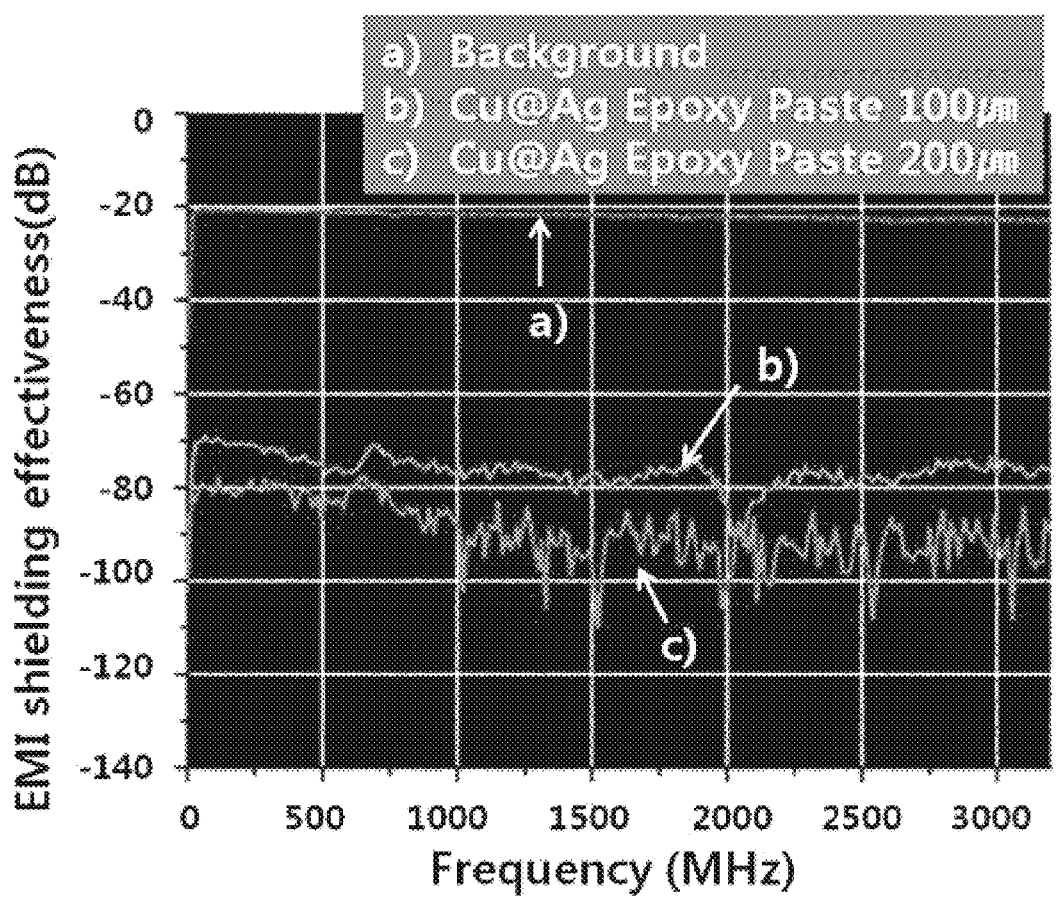
FIG. 3 is graph showing data of measurements of an electromagnetic interference shielding effectiveness of a conductive film produced by coating a substrate with an epoxy paste composition according to an example of the present invention.

After two conductive films having different thicknesses were prepared, an electromagnetic interference shielding test was conducted. As shown in FIG. 3, when the epoxy paste composition was coated at a thickness of 30 μm, about 55 dB of the electromagnetic interference shielding effectiveness at 1500 MHz was measured. In addition, when the epoxy paste composition was coated at a thickness of 75 μm, about 70 dB of the electromagnetic interference shielding effectiveness at 1500 MHz was measured.

Accordingly, when the conductive film is produced using the epoxy paste composition in the present invention, an excellent conductivity and electromagnetic interference shielding property may be realized. In addition, with the advantages described above, the epoxy paste composition may be widely applied to various fields such as an electromagnetic interference shielding and an absorbing product, an electrode, an electronic circuit, an antenna, and the like.

TABLE 2

| | Application thickness (μm) | Coating thickness (μm) | Sheet resistance (Ω/□) | Specific resistance (Ω·m) | Shielding effectiveness (dB) |
|---|---|---|---|---|---|
| Example 1 | 100 | 30 | $1.6 \times 10^{-1}$ | $4.8 \times 10^{-6}$ | 55 |
| Example 1 | 200 | 75 | $6.4 \times 10^{-2}$ | $4.8 \times 10^{-6}$ | 70 |
| Comparative Example 1 | 100 | 30 | $8.0 \times 10^{0}$ | $2.4 \times 10^{-4}$ | 20 |
| Comparative Example 1 | 200 | 70 | $3.4 \times 10^{0}$ | $2.4 \times 10^{-4}$ | 30 |
| Comparative Example 2 | 100 | 28 | $1.5 \times 10^{1}$ | $4.2 \times 10^{-4}$ | 15 |
| Comparative Example 2 | 200 | 68 | $6.2 \times 10^{0}$ | $4.2 \times 10^{-4}$ | 25 |
| Comparative Example 3 | 100 | 30 | $2.23 \times 10^{2}$ | $6.7 \times 10^{-2}$ | 5 |
| Comparative Example 3 | 200 | 70 | $9.6 \times 10^{1}$ | $6.7 \times 10^{-2}$ | 10 |

As shown in Tables 1 and 2, when the epoxy paste composition includes 55 to 70 wt % of a silver-coated copper nanowire having a core-shell structure, 1 to 35 wt % of an epoxy resin, and 1 to 35 wt % of a curing agent, it was confirmed that the conductive film has an excellent electrical conductivity and a low sheet resistance and specific resistance, and has a high electromagnetic interference shielding effectiveness.

Hereinabove, in the present invention, although the epoxy paste composition including a silver-coated copper nanowire having a core-shell structure and the conductive film including the same have been described by specific matters and limited embodiments, they have been provided only for assisting in the entire understanding of the present invention. Therefore, the present invention is not limited to the above embodiments, and various modifications and changes may be made by those skilled in the art to which the present invention pertains from this description.

Therefore, the spirit of the present invention should not be limited to these exemplary embodiments, but the claims and all of modification equal or equivalent to the claims are intended to fall within the scope and spirit of the present invention.

The invention claimed is:

1. An epoxy paste composition comprising:
   48 to 58 wt % of a silver-coated copper nanowire having a core-shell structure;
   1 to 35 wt % of an epoxy resin; and 1 to 35 wt % of a curing agent;
   wherein within the weight % range, the silver-coated copper nanowire:the epoxy resin is included in a weight ratio of 4 to 5.5:1.

2. The epoxy paste composition of claim 1, wherein an amount of silver is 2 to 60 parts by weight based on 100 parts by weight of a total amount of the silver-coated copper nanowire.

3. The epoxy paste composition of claim 1, wherein a ratio (f/a) of a largest diameter (f) of a cross section of the silver-coated copper nanowire perpendicular to a length direction to a length (a) of the silver-coated copper nanowire is 0.0001 to 0.06.

4. The epoxy paste composition of claim 1, wherein the curing agent is any one or two or more selected from the group consisting of an acid anhydride-based curing agent, a phenol-based curing agent, an imidazole-based curing agent, and an amino-based curing agent.

5. The epoxy paste composition of claim 1, wherein the epoxy resin is any one or two or more selected from the group consisting of a bisphenol A type epoxy resin, a bisphenol F type epoxy resin, a bisphenol S type epoxy resin, a phenol novolac type epoxy resin, a cresol novolac type epoxy resin, an alkylphenol novolac type epoxy resin, a biphenyl type epoxy resin, a naphthalene type epoxy resin, a dicyclopentadiene type epoxy resin, triglycidyl isocyanate, an urethane-modified epoxy resin, and a non-aromatic epoxy resin.

6. The epoxy paste composition of claim 1, further comprising a diluent, wherein the diluent is any one or two or more selected from the group consisting of acetone, methyl ethyl ketone, methyl alcohol, ethyl alcohol, isopropyl alcohol, butyl alcohol, ethylene glycol, polyethylene glycol, tetrahydrofuran, dimethylformamide, dimethylacetamide, N-methyl-2-pyrrolidone, hexane, cyclohexanone, toluene, chloroform, dichlorobenzene, dimethylbenzene, trimethylbenzene, pyridine, methylnaphthalene, nitromethane, acrylonitrile, octadecylamine, butyl carbitol acetate, aniline, dimethyl sulfoxide, diethylene glycol ethyl ether, and terpineol.

7. A conductive film produced by applying the epoxy paste composition of claim 1 on a substrate and curing.

8. The conductive film of claim 7, wherein the curing is performed at 100 to 200° C. for 20 to 60 minutes.

9. The conductive film of claim 7, wherein a specific resistance of the conductive film is $1.0 \times 10^{-5}$ to $6.0 \times 10^{-6}$ Ω·m, and an electromagnetic interference shielding effectiveness of the conductive film at 1500 MHz is 20 to 70 dB.

10. An electromagnetic interference shielding film produced by applying the epoxy paste composition of claim 1 on a substrate and curing.

* * * * *